(12) United States Patent
Chien et al.

(10) Patent No.: US 9,190,362 B2
(45) Date of Patent: Nov. 17, 2015

(54) IMAGE SENSOR PACKAGE WITH TRENCH INSULATOR AND FABRICATION METHOD THEREOF

(71) Applicant: XINTEC INC., Jhongli, Taoyuan County (TW)

(72) Inventors: Wen-Cheng Chien, Hsinchu (TW); Wen-Ken Huang, Hsinchu (TW); Chien-Hung Liu, New Taipei (TW); Joey Lai, Hsinchu (TW)

(73) Assignee: XINTEC INC., Taoyuan (TW)

( * ) Notice: Subject to any disclaimer, the term of this patent is extended or adjusted under 35 U.S.C. 154(b) by 0 days.

(21) Appl. No.: 14/325,812

(22) Filed: Jul. 8, 2014

(65) Prior Publication Data

US 2014/0319670 A1    Oct. 30, 2014

Related U.S. Application Data

(60) Division of application No. 12/753,519, filed on Apr. 2, 2010, now Pat. No. 8,772,919, which is a continuation-in-part of application No. 12/565,470, filed on Sep. 23, 2009, now abandoned, which is a division of application No. 11/987,228, filed on Nov. 28, 2007, now abandoned.

(60) Provisional application No. 61/235,153, filed on Aug. 19, 2009.

(30) Foreign Application Priority Data

Aug. 8, 2007   (TW) ................................ 96129207 A

(51) Int. Cl.
*H01L 21/00* (2006.01)
*H01L 23/00* (2006.01)
*H01L 27/146* (2006.01)

(52) U.S. Cl.
CPC .............. *H01L 23/562* (2013.01); *H01L 24/05* (2013.01); *H01L 24/97* (2013.01); *H01L 27/14618* (2013.01); *H01L 27/14683* (2013.01); *H01L 2224/02235* (2013.01); *H01L 2924/1461* (2013.01)

(58) Field of Classification Search
CPC ................... H01L 2924/00; H01L 2924/1461; H01L 2924/10253; H01L 2924/3025; H01L 2224/45169; H01L 2924/01322; H01L 2224/48472; H01L 2225/06513; H01L 25/0657; H01L 25/50; H01L 2924/01005; H01L 2924/01033
USPC ........ 257/433, E31.001, E21.001; 438/64, 24
See application file for complete search history.

(56) References Cited

U.S. PATENT DOCUMENTS

2009/0001495 A1 *   1/2009   Weng et al. .................... 257/433

* cited by examiner

*Primary Examiner* — Mark A Laurenzi
(74) *Attorney, Agent, or Firm* — Liu & Liu

(57) ABSTRACT

The invention provides a chip package and a fabrication method thereof. In one embodiment, the chip package includes: a substrate having a semiconductor device and a conductive pad thereon; an insulator ring filling a trench formed in the substrate, wherein the insulator ring surrounds an intermediate layer below the conductive pad; and a conductive layer disposed below a backside of the substrate and electrically connected to the conductive pad.

20 Claims, 7 Drawing Sheets

IMAGE SENSOR PACKAGE WITH TRENCH INSULATOR AND FABRICATION METHOD THEREOF

CROSS REFERENCE TO RELATED APPLICATIONS

This application is a Division of application Ser. No. 12/753,519, filed on Apr. 2, 2010, which is a Continuation-In-Part of application Ser. No. 12/565,470, filed on Sep. 23, 2009, which is a Division of application Ser. No. 11/987,228, filed on Nov. 28, 2007, which claims priority to Taiwan Patent Application no. 96129207, filed on Aug. 8, 2007, the entirety of which is incorporated by reference herein. This application Ser. No. 12/753,519 also claims the benefit of U.S. Provisional Application No. 61/235,153, filed on Aug. 19, 2009, the entirety of which is incorporated by reference herein.

BACKGROUND OF THE INVENTION

1. Field of the Invention

The invention relates to a chip package, and more particularly to a chip package with a ring insulator and a fabrication method thereof.

2. Description of the Related Art

Photosensitive integrated circuits play an important role in image sensor devices which are widely used in consumer devices, such as digital cameras, digital video recorders, mobile phones, and portable devices. With consumer's demanding lighter and lighter portable devices, requirement to reduce the dimensions of image sensor packages has increased.

FIG. 1 is a cross section of a conventional image sensor package 1. In FIG. 1, a substrate 2 with an image sensor device 4 electrically connected to an extending bonding pad 6 thereon is provided. A covering plate 8 is then disposed on the substrate 2 followed by the substrate 2 being attached to a carrying plate 14. As shown in FIG. 1, a conductive layer 10 is formed on a backside of the carrying plate 14 and extended to the sidewalls of the carrying plate 14 and the substrate 2 electrically connects the extending bonding pad 6 to a solder ball 12. The image sensor package has large dimensions since the image sensor package structures require both the substrate and the carrying plate which have a certain amount of thickness. Moreover, because the conductive layer is formed close to an exterior area of the image sensor package, for example the sidewalls of the substrate and the carrying plate, damage to the conductive layer may occur during fabrication, resulting in device failure.

Thus, a chip package and fabrication method thereof eliminating the described problems is needed.

BRIEF SUMMARY OF INVENTION

Accordingly, the invention provides a chip package. An exemplary embodiment of the chip package comprises: a substrate having a semiconductor device and a conductive pad thereon; an insulator ring filling a trench formed in the substrate, wherein the insulator ring surrounds an intermediate layer below the conductive pad; and a conductive layer disposed below a backside of the substrate and electrically connected to the conductive pad.

The invention also provides a method for fabricating a chip package. An exemplary embodiment of the method comprises: providing a substrate having a semiconductor device and a conductive pad thereon; disposing a covering plate over the substrate; forming a trench in the substrate; forming an insulator ring in the trench, wherein the insulator ring surrounds an intermediate layer below the conductive pad; and forming a conductive layer below a backside of the substrate and electrically connected to the conductive pad.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

The embodiments of chip packages of the invention and fabrication methods thereof are illustrated by embodiments of fabricating image sensor chip packages in the following description. However, it should be appreciated that the invention may also be applied to forming other semiconductor chips. Therefore, the packages of the embodiments of the invention may be applied to active or passive devices, or electronic components with digital or analog circuits, such as optoelectronic devices, micro electro mechanical systems (MEMS), micro fluidic systems, and physical sensors for detecting heat, light, or pressure. Particularly, a wafer scale package (WSP) process may be applied to package semiconductor chips, such as image sensor devices, light-emitting diodes (LEDs), solar cells, RF circuits, accelerators, gyroscopes, micro actuators, surface acoustic wave devices, pressure sensors, and ink printer heads.

The wafer scale package process mentioned above mainly means that after the package process is accomplished during the wafer stage, the wafer with chips is cut to obtain separate independent packages. However, in an embodiment of the invention, separate independent chips may be redistributed overlying a supporting wafer and then be packaged, which may also be referred to as a wafer level chip scale package (WLCSP) process. In addition, the above mentioned wafer scale package process may also be adapted to form chip packages of multi-layered integrated circuit devices by stacking a plurality of wafers having integrated circuits.

Figure 1:
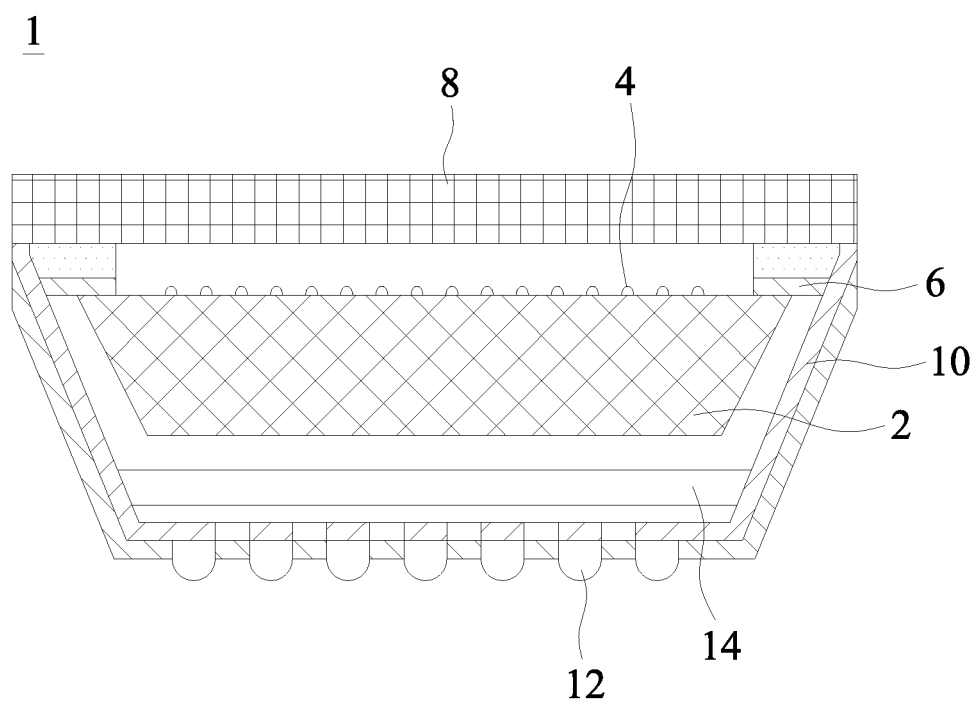
FIG. 1 is a cross section of a conventional image sensor package.
Figure 2:
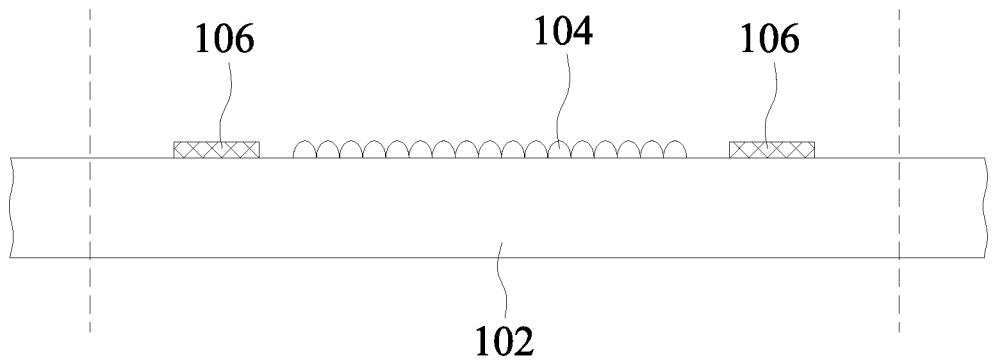
FIGS. 2-7 are schematic views illustrating a method for fabricating a chip package according to a first embodiment of the invention.

Referring to FIG. 2, a substrate 102 is provided with an image sensor device 104 and a conductive pad 106 thereon, which are electrically connected to each other. The substrate 102 may be made of Si, Ge, SiGe, or other suitable semiconductor materials such as SiC, GaAs, GaAsP, AlGaAs, and GaInP. In one embodiment, the image sensor device 104 is fabricated on the substrate 102 by a complementary metal-oxide-semiconductor (CMOS) process. Then, the conductive pad 106 is formed on the substrate 102 by a metallization process and is electrically connected to the image sensor device 104.

In the case, the image sensor device 104 may be complementary metal-oxide-semiconductor device or charge-coupled device (CCD) for capturing pictures or images. The conductive pad 106, preferably, is made of a conductive material such as copper (Cu), aluminum (Al) or tungsten (W).

Note that while the conductive pad 106 is illustrated as a signal layer in the embodiments of the invention, the conductive pad 106 may also be an interconnection structure comprising of dielectric layers sandwiched between conductive pads, whereby the conductive pads are connected to each other by the metal plugs. In one embodiment of the interconnection structure, the bottommost conductive pad is directly formed on the substrate and the uppermost conductive pad is stacked over the bottommost conductive pad to electrically connect the image sensor device and the bottommost conductive pad.

Figure 3:
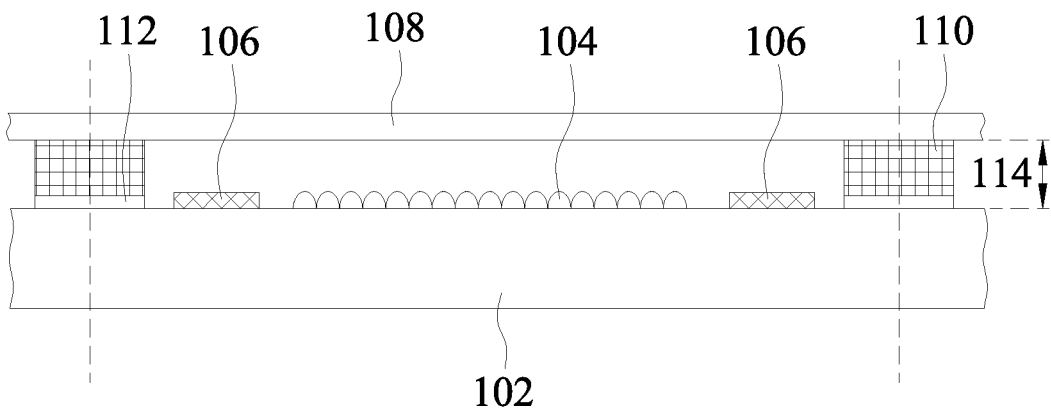

Referring to FIG. 3, a covering plate 108 is disposed over the substrate 102. In some embodiments, a support member 110, made of material such as epoxy, polyimide (PI), photoresist or any other suitable materials, is formed on the covering plate 108. Then, an adhesive layer 112, made of material such as epoxy, is coated on the support member 108, and the covering plate 108 is bonded to the substrate 102 to form a distance 114 therebetween. Preferably, the covering plate 108 is made of a transparent material such as glass, quartz or any other suitable materials. Additionally, a polymer material such as polyester may also be used in the covering plate 108.

Alternatively, the support member 110 may be formed on the substrate 102 followed by coating of the adhesive layer 112 on the support member 110. Next, the covering plate 108 is bonded to the support member 110 to dispose the covering plate 108 over the substrate 102.

After bonding, the substrate 102 is then thinned. In one embodiment, the substrate 102 is ground from its backside by, for example, a chemical mechanical polishing (CMP) process to thin the substrate 102 to an adequate thickness. Preferably, the thickness is less than 150 µm, for example. After thinning, the substrate 102 is notched from its backside to form a trench 116 in the substrate 102, as shown in FIG. 4.

Figure 4:
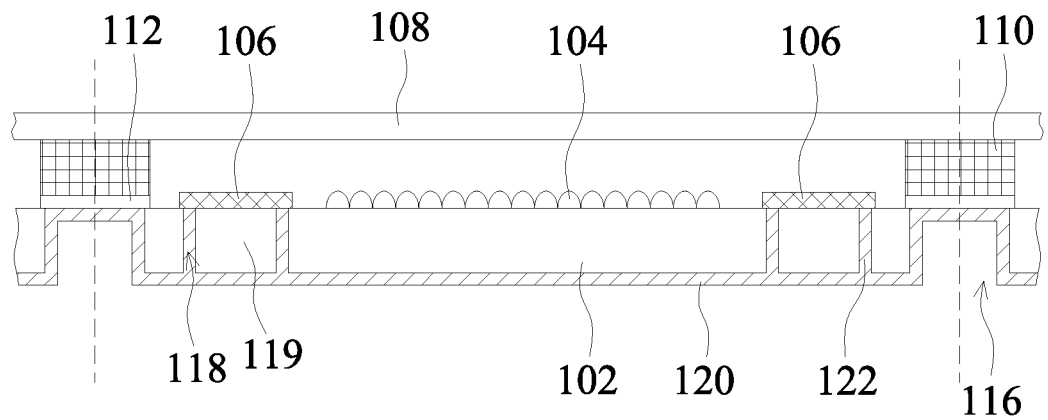

In FIG. 4, a trench insulator (also referred to as "insulator ring") 122 is formed in the substrate 102. In some embodiments, the backside of the substrate 102 is etched by, for example, a dry-etching process to form a trench 118 in the substrate 102, in which the trench 118 surrounds a portion of the substrate 102. Next, an isolating layer 120, made of material such as silicon oxide, silicon nitride, silicon oxynitride or any other suitable insulators, is formed on the backside of the substrate 102 and fills the trench 118 to form the trench insulator 122 which surrounds an isolation region 119. It is understood that a patterned photoresist (not shown) is formed on the backside of the substrate 102 prior to the dry-etching process to mask a portion of the substrate 102 and expose other portions for removal.

In one embodiment, a laser drilling step is also possible to be used in formation of the trench 118 followed by depositing the isolating layer 120 in the trench 118 to form the trench insulator 122 and the isolation region 119. Note that the isolation region 119 surrounded by the trench insulator 122, is located in an area below and corresponding to the conductive pad 106.

Figure 5:
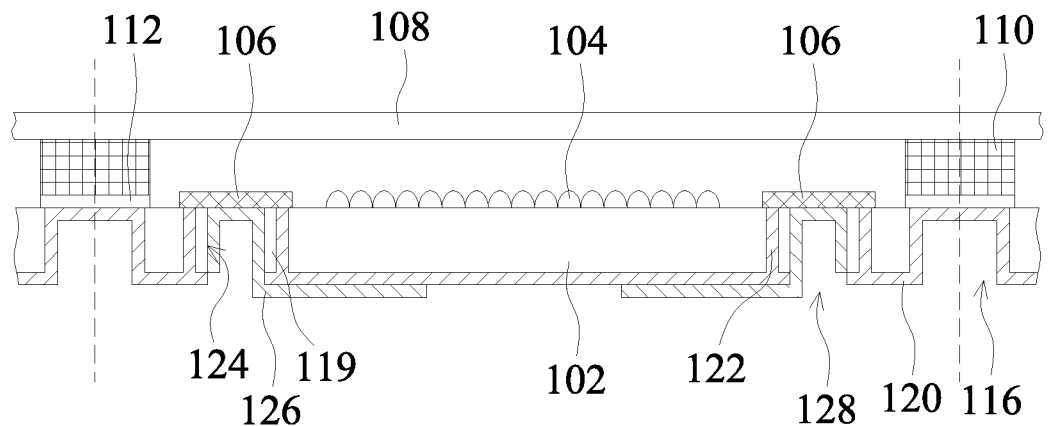

Referring to FIG. 5, a through via 128 is formed in the isolation region 119 of the substrate 102. In one embodiment, a portion of the isolating layer 120, which covers the isolation region 119, is removed to expose a surface of the substrate 102 in the isolation region 119. Next, a through hole 124 is formed by, for example, a dry-etching, laser drilling or any other suitable process, to expose the conductive pad 106. Thereafter, a conductive layer 126 is formed on the backside of the substrate 102, extending to the through hole 124, to form the through via 128 which is electrically connected to the conductive pad 106. Note that the trench insulator 122 surrounds the through via 128 for isolation.

In some embodiments, a conductive material layer (not shown), made of material such as aluminum (Al), copper (Cu) or nickel (Ni), is conformally formed on the backside of the substrate 102 and extends to the through hole 124 to electrically connect to the conductive pad 106 by, for example a sputtering, evaporating, electroplating or electroless plating process. The conductive material layer is then patterned by a photolithography and etching process to form the conductive layer 126 and the through via 128. Note that a signal conductive path of a chip package which is later formed can be redistributed by the patterning step to the conductive material layer.

Figure 6:
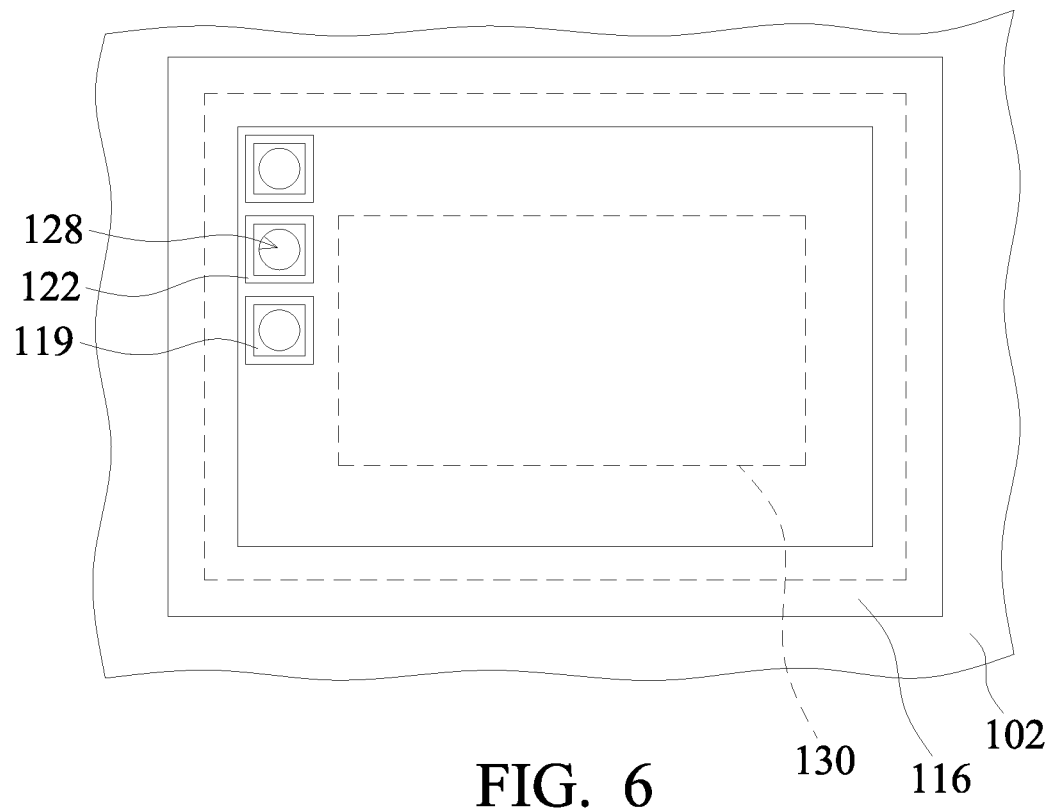

FIG. 6 is a top view of a backside of the semi-finished chip package illustrated in FIG. 5. In FIG. 6, several elements shown in FIG. 5 are omitted for simplicity. Referring to FIG. 6, the substrate 102 is divided into several dies through the trench 116. Each die comprises a device region such as an image sensor device region 130, as a dotted line shows in FIG. 6, where a semiconductor device such as the image sensor device 104 (shown in FIG. 5) is located. Moreover, the trench insulator 122, the isolation region 119 and the through via 128 are located at an area outside of the image sensor region device 130, wherein the trench insulator 122 surrounds the isolation region 119 where the through via 128 is formed. Specifically, the trench insulator 122 does not only surround the isolation region 119, but also the through via 128.

Note that although several trench insulators 122 and through vias 128 are shown in FIG. 6, in a practical embodiment, numerous trench insulators 122 and through vias 128 may surround the image sensor device region 130. Moreover, while the geometric shape of the isolation region 119 surrounded by the trench insulator 122 is a rectangular shape, the geometric shape of the isolation region 119 may also be a circular shape. In this case, the trench insulator 122 and the through via 128 would be concentric circles.

Figure 7:
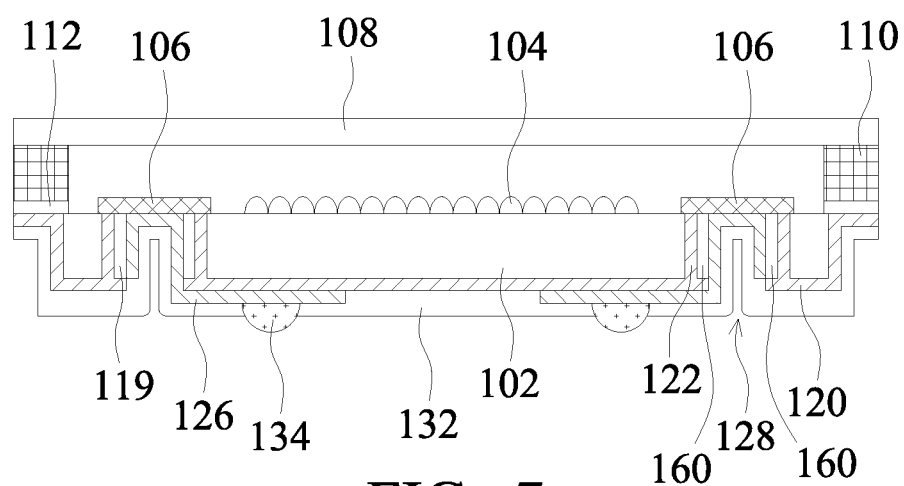

Referring to FIG. 7, a passivation layer such as a solder mask 132 is coated on the backside of the substrate 102 and covers the conductive layer 126, wherein the solder mask 132 may be patterned to expose a portion of the conductive layer 126. Next, a conductive bump such as a solder ball 134 is disposed on the conductive layer 126 and further connects to the conductive pad 104 by the through via 128. In one embodiment, after the solder mask 132 is formed, a solder material (not shown) is coated on the exposed conductive layer 126, and a reflow step is performed to form the solder ball 134 on the conductive layer 126. Following the described steps, an individual die is cut out along a predetermined cutting line by a cutter. Thus, completing an image sensor package 150, as shown in FIG. 7. Alternatively, a dry-etching step may also be used in cutting of the die.

FIG. 7 is a cross section of a chip package 150 according to an embodiment of the invention. In FIG. 7, a substrate 102 is provided with an image sensor device 104 and a conductive pad 106 formed thereon. A trench insulator or insulator ring 122 is formed in the substrate 102 and surrounds a portion of the substrate 102 below the conductive pad 106. The portion of the substrate 102 surrounded by the trench insulator is referred to as "an intermediate layer 160". Therefore, in this embodiment, the intermediate layer 160 is disposed between the trench insulator 122 and the through via 128 and at least includes a substrate material such as Si, Ge, SiGe, SiC, GaAs, GaAsP, AlGaAs, GaInP or other suitable semiconductor materials. A conductive layer 126 is disposed below a backside of the substrate 102 and is electrically connected to the conductive pad 106. Thus, the conductive layer electrically connects the conductive pad 106 to a solder ball 134. A covering plate 108 is further disposed over the substrate 102.

In the chip package according to the embodiment of the invention, because the conductive pad connects to the through hole within the isolation region, a signal from the image sensor device is transmitted to an exterior circuit via the conductive pad, the through hole and the conductive layer, rather than traveling around the sidewalls of the substrate to transmit the signal. Thus, the signal conductive path to the image sensor device is shortened. Moreover, because the conductive layer is not formed close to an exterior area of the image sensor package, damage to the conductive layer during fabrication is reduced, thereby improving fabrication yield.

Note that because the substrate is thinned, the overall thickness of the image sensor package is reduced. Thus, the image sensor package according to the embodiment of the invention has relatively small dimensions. Moreover, because extra steps, such as the attaching step for bonding a chip to a carrying plate or the etching step for separating the chip, are not required, fabrication of the image sensor package is simplified and costs are reduced.

Figure 8:
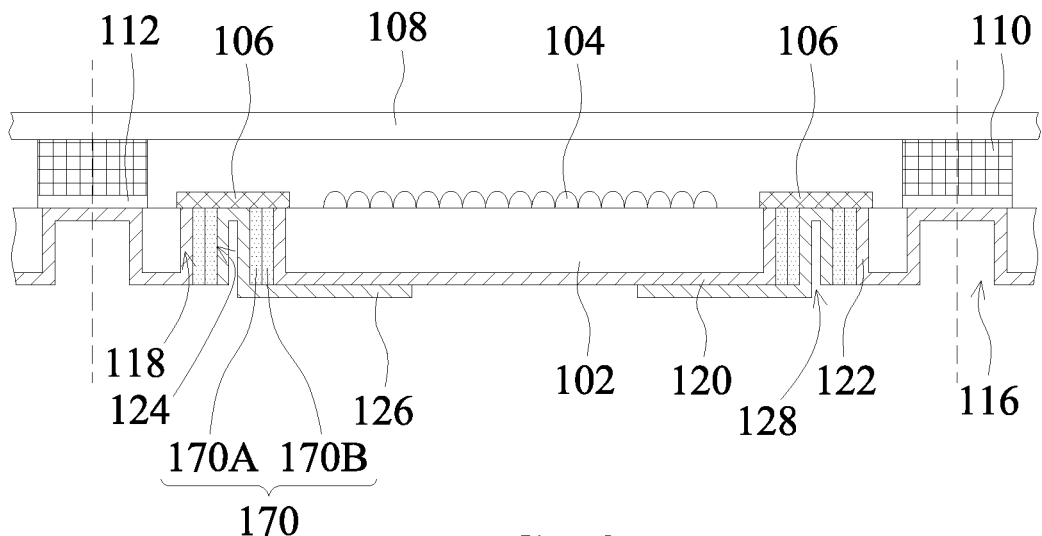
FIGS. 8-9 schematic views illustrating a method for fabricating a chip package according to a second embodiment of the invention.
Figure 9:
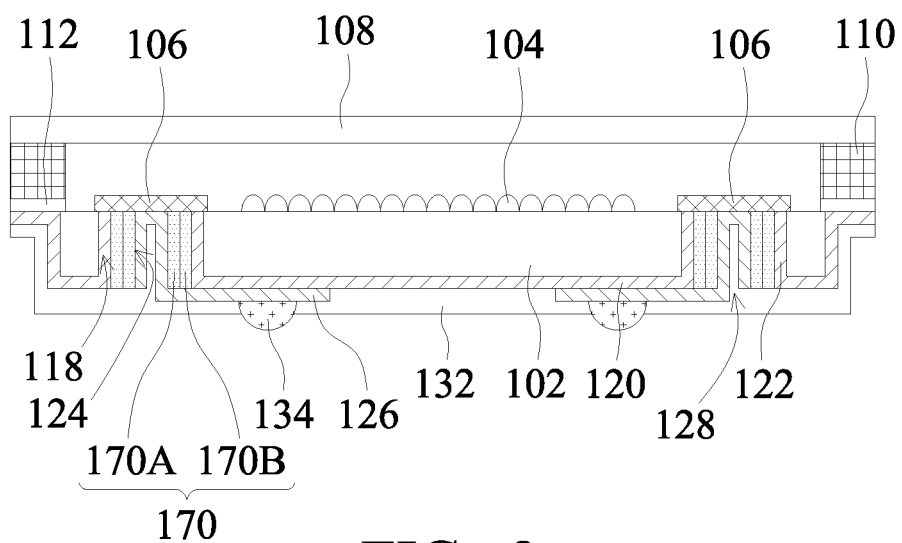

Referring to FIGS. 8-9, a second embodiment of the invention is illustrated. Like reference numbers from the first embodiment are utilized where appropriate. The initial steps of this embodiment are similar to that shown in FIGS. 2 through 4. After formation of the trench insulator 122 in the substrate 102, an intermediate layer comprising a multilayer structure 170 is formed in the region surrounded by the trench insulator 122 before forming the through via 128. FIG. 8 illustrates a multilayer structure composed of two layers 170A, 170B. It will be appreciated, however, that the multilayer structure 170 may comprise more than two layers. In an exemplary embodiment, the multilayer structure is composed of materials having a CTE (coefficient of thermal expansion) between a CTE of the trench insulator 122 and a CTE of the conductive layer 126. As such, the difference between the CTEs of the trench insulator 122 and the conductive layer 126 can be adjusted by the multilayer structure 170 to prevent the chip package from delaminating during a thermal cycle, thereby enhancing reliability.

The multilayer structure 170 may be composed of semiconductor materials, insulating materials, or combinations thereof. Suitable semiconductor materials include, but are not limited to, Si, Ge, SiGe, SiC, GaAs, GaAsP, AlGaAs, and GaInP. Suitable insulating materials may be an epoxy resin, solder mask or other inorganic/organic insulating materials. Examples of inorganic insulating materials include silicon oxide, silicon nitride, silicon oxinitride, and metal oxide. Examples of organic insulating material include polyimide (PI), butylcyclobutene (BCB), parylene, polynaphthalenes, fluorocarbons, and accrylates.

The multilayer structure 170 can be formed by a coating method, such as a spin coating method, a spray coating method, or a curtain coating method, or other suitable deposition methods, such as liquid phase deposition, physical vapor deposition (PVD) method, chemical vapor deposition (CVD), or epitaxial growth methods.

In one approach, the portion of the substrate 102 surrounded by the trench insulator 122 is completely removed by a dry etching or wet etching process to form a recess below the conductive pad 106. Then, a plurality of layers are deposited in the recess by the above described methods and anisotropically etched back to remove the materials outside of the recess and expose the conductive pad 106, thus forming the multilayer structure 170. In another approach, the portion of the substrate 102 surrounded by the trench insulator 122 is only partially etched away. Then, one or more layers are deposited and etched back to form a multilayer structure which includes a portion of the substrate 102 not etched.

Thereafter, a conductive layer 126 is formed on the backside of substrate 102 and extends to the conductive pad 106 to form a through via 128, electrically connected o the conductive pad 106. Subsequently, a passivation layer such a solder mask 132 and a conductive bump such as a solder ball 134 are formed in the same manner as described in connection with FIG. 7. After a cutting process, an individual chip package 200, as shown in FIG. 9, is completed.

Figure 10:
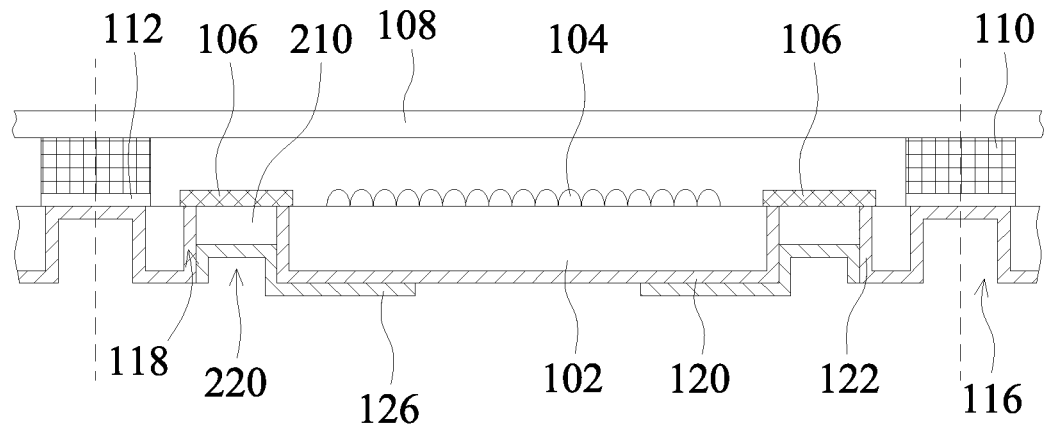
FIGS. 10-12 schematic views illustrating a method for fabricating a chip package according to a third embodiment of the invention.
Figure 11:
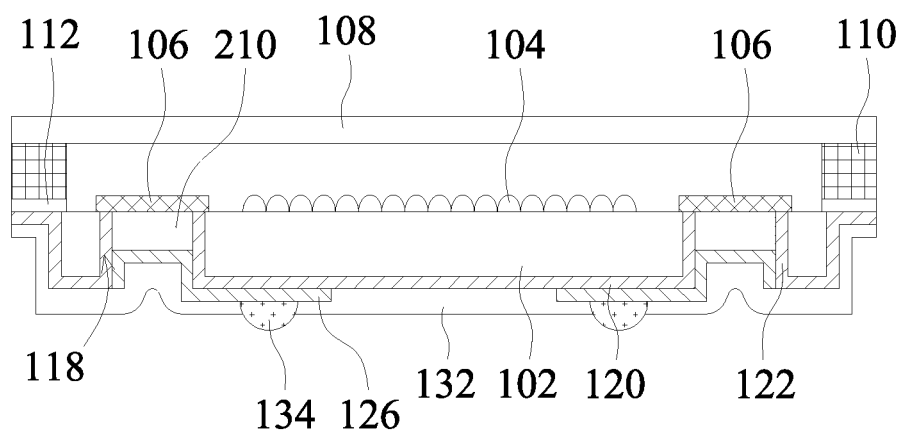
Figure 12:
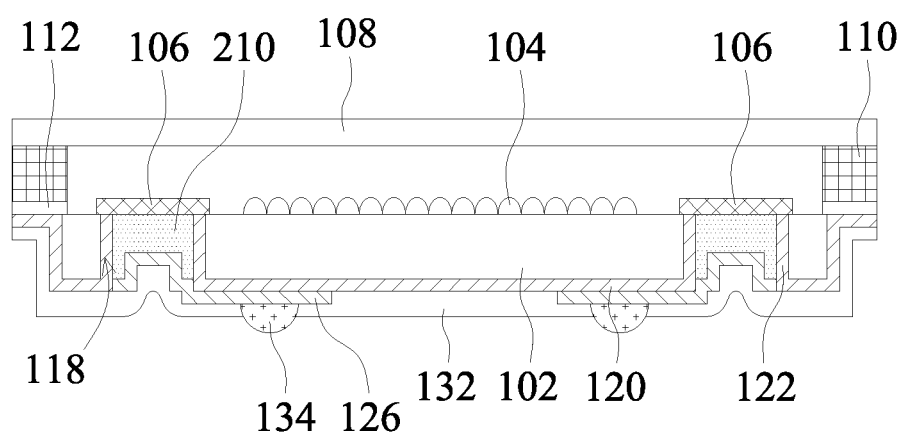

Referring to FIGS. 10-12, a third embodiment of the invention is illustrated. Like reference numbers from the above described embodiment are utilized where appropriate. The initial steps of this embodiment are similar to that shown in FIGS. 2 through 4. After formation of the trench insulator 122 in the substrate 102, instead of forming a through hole 124 like in the first embodiment, a via hole 220 is formed extending partially down into the substrate in the region 119. The via hole 220 exposes an intermediate layer 210 below the conductive pad 106. In this embodiment, the intermediate layer 210 is a portion of the substrate 102 which is heavily doped for electrical connection. The heavily doped region 210 can be an N-type or P-type region formed by an ion implantation or diffusion process before or after the formation of the via hole 220. For example, the heavily doped region 210 may be an N-type region by implanting arsenic or phosphorous ions in a dose of about 1E14 to 6E15 atoms/cm$^2$.

Thereafter, a conductive layer 126 is formed on the backside of substrate 102 and extends to the heavily doped region 210 to electrically connect to the conductive pad 106. Subsequently, a passivation layer such a solder mask 132 and a conductive bump such as a solder ball 134 are formed in the same manner as described in connection with FIG. 7. After a cutting process, an individual chip package 250, as shown in FIG. 11, is completed.

FIG. 12 illustrates a variant form of the third embodiment. In FIG. 12, the conductive layer 126 extends into a portion of the heavily doped region 210. This configuration is formed when only a central portion of the region 119 is removed when the via hole 220 is etched. Thus, it can be understood that the arrangement of the heavily doped region 120 and the conductive layer 126 is not limited by the illustrated drawings, as long as the conductive layer 126 is electrically connected to the conductive pad 106 through the heavily doped region 120.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:
1. A method for fabricating a chip package, comprising:
providing a substrate having a semiconductor device and a conductive pad thereon;
disposing a covering plate over the substrate;
forming a trench in the substrate;

forming an insulator ring in the trench, wherein the insulator ring continuously surrounds an intermediate layer below the conductive pad; and forming a conductive layer below a backside of the substrate and electrically connected to the conductive pad.

2. The method as claimed in claim 1, wherein disposing the covering plate comprises:

forming a support member on the covering plate;
coating an adhesive layer on the support member; and
bonding the covering plate to the substrate.

3. The method as claimed in claim 1, wherein the trench is formed by laser drilling or dry-etching.

4. The method as claimed in claim 1, wherein the trench surrounds a circular region or a rectangular region.

5. The method as claimed in claim 1, wherein the insulator ring comprises a material of silicon oxide, silicon nitride or silicon oxynitride.

6. The method as claimed in claim 1, further comprising forming a through hole in a region surrounded by the trench.

7. The method as claimed in claim 6, wherein the intermediate layer comprises a semiconductor material disposed between the through hole and the insulator ring.

8. The method as claimed in claim 6, wherein the intermediate layer comprises a multilayer structure disposed between the through hole and the insulator ring.

9. The method as claimed in claim 8, wherein the multilayer structure comprises semiconductor materials, insulating materials, or combinations thereof.

10. The method as claimed in claim 8, wherein the multilayer structure comprises materials having a coefficient of thermal expansion between a coefficient of thermal expansion of the insulator ring and a coefficient of thermal expansion of the conductive layer.

11. The method as claimed in claim 1, further comprising forming a via hole partially down to the substrate in a region surrounded by the trench.

12. The method as claimed in claim 11, wherein the intermediate layer comprises a heavily doped region exposed by the via hole, and the conductive layer is electrically connected to the conductive pad through the heavily doped region.

13. The method as claimed in claim 12, wherein the conductive layer extends into a portion of the heavily doped region.

14. The method as claimed in claim 1, wherein entire intermediate layer is continuously surrounded by the insulator ring.

15. The method as claimed in claim 14, wherein entire intermediate layer is continuously surrounded by the insulator ring in a plane comprising the insulating ring and the intermediate layer.

16. The method as claimed in claim 1, wherein the insulator ring is a continuous structure that surrounds a perimeter of the intermediate layer.

17. The method as claimed in claim 16, wherein the insulator ring surrounds an entire perimeter of the intermediate layer in a plane comprising the insulating ring and the intermediate layer.

18. The method as claimed in claim 16, wherein the insulator ring is a continuous structure that completely surrounds a perimeter of the intermediate layer.

19. A method for fabricating a chip package, comprising:

providing a substrate having a semiconductor device and a conductive pad thereon;

disposing a covering plate over the substrate;

forming a trench in the substrate;

forming an insulator ring in the trench, wherein the insulator ring coaxially surrounds an intermediate layer that comprises a material of the substrate coaxially surrounded by the trench, wherein the insulator ring, the intermediate layer and the trench form a coaxial structure directly below the conductive pad, and wherein the insulator ring, the intermediate layer and the trench are coaxially located directly below the conductive pad; and forming a conductive layer below a backside of the substrate and electrically connected to the conductive pad.

20. A method for fabricating a chip package, comprising:

providing a substrate having a semiconductor device and a conductive pad thereon;

disposing a covering plate over the substrate;

forming a coaxial structure in the substrate directly below the conductive pad, wherein said coaxial structure comprises an insulator ring and an intermediate layer comprising a material of the substrate coaxially disposed within the insulator ring, and wherein both the insulator ring and the intermediate layer are located directly below the conductive pad; and forming a conductive layer below a backside of the substrate and electrically connected to the conductive pad.

* * * * *